(12) United States Patent
Jung et al.

(10) Patent No.: US 7,759,052 B2
(45) Date of Patent: *Jul. 20, 2010

(54) ANTI-REFLECTIVE POLYMER, ANTI-REFLECTIVE COMPOSITION CONTAINING THE SAME, AND METHOD FOR FORMING PATTERN USING THE SAME

(75) Inventors: Jae Chang Jung, Seoul (KR); Sung Koo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 142 days.

This patent is subject to a terminal disclaimer.

(21) Appl. No.: 12/135,644

(22) Filed: Jun. 9, 2008

(65) Prior Publication Data

US 2009/0042141 A1  Feb. 12, 2009

(30) Foreign Application Priority Data

Aug. 9, 2007 (KR) .................. 10-2007-0079945

(51) Int. Cl.
*G03F 7/11* (2006.01)
*G03F 7/26* (2006.01)
*C08F 28/00* (2006.01)

(52) U.S. Cl. ............... 430/325; 430/327; 430/326; 430/271.1; 525/328.5; 525/328.7

(58) Field of Classification Search ............... None
See application file for complete search history.

(56) References Cited

U.S. PATENT DOCUMENTS

| | | | | |
|---|---|---|---|---|
| 3,350,367 | A * | 10/1967 | wakasa | 528/378 |
| 4,861,705 | A * | 8/1989 | Margel | 435/2 |
| 5,593,725 | A | 1/1997 | Park et al. | |
| 5,674,648 | A * | 10/1997 | Brewer et al. | 430/18 |
| 6,319,835 | B1 * | 11/2001 | Sahbari et al. | 438/689 |
| 6,458,908 | B1 * | 10/2002 | Imai et al. | 526/259 |
| 6,489,432 | B2 * | 12/2002 | Jung et al. | 528/230 |
| 6,695,540 | B1 * | 2/2004 | Taquino | 405/216 |
| 2004/0014935 | A1 * | 1/2004 | Choi et al. | 528/374 |
| 2005/0277755 | A1 * | 12/2005 | Hamada et al. | 528/32 |
| 2007/0099110 | A1 * | 5/2007 | Jung | 430/270.1 |

FOREIGN PATENT DOCUMENTS

KR  10-2001-0018906  3/2001
KR  10-2005-0015268  2/2005

OTHER PUBLICATIONS

Machine generated English translation of KR 10-0833361, gnerated from the KIPO website on May 27, 2010, 34 pages.*
Machine generated English translation of KR 10-2005-0015268, gnerated from the KIPO website on May 27, 2010, 17 pages.*

* cited by examiner

*Primary Examiner*—Cynthia Hamilton
(74) *Attorney, Agent, or Firm*—Marshall, Gerstein & Borun LLP

(57) ABSTRACT

A polymer for crosslinking an anti-reflective film has a high refractive index. An anti-reflective composition containing the polymer is useful in a damascene process and an immersion lithography process using ArF (193 nm) of a semiconductor device manufacturing process.

11 Claims, 3 Drawing Sheets

ANTI-REFLECTIVE POLYMER, ANTI-REFLECTIVE COMPOSITION CONTAINING THE SAME, AND METHOD FOR FORMING PATTERN USING THE SAME

CROSS-REFERENCE TO RELATED APPLICATION

The priority of Korean patent application number 10-2007-0079945, filed on Aug. 9, 2007, the disclosure of which is incorporated by reference in its entirety, is claimed.

BACKGROUND OF THE INVENTION

The invention relates to a polymer for crosslinking an anti-reflective film that has a high refractive index and an anti-reflective composition containing the same that is particularly useful in a damascene process and in an immersion lithography process using ArF (193 nm) of a semiconductor device manufacturing process.

In a process for forming ultra fine patterns, standing waves and reflective notching resulting from changes in optical properties and resist thicknesses of bottom films of photoresist films, and fluctuation of critical dimensions due to diffracted light and reflected light from the bottom films unavoidably occur. As a result, materials for absorbing light in wavelength range of the light used as an exposure light source have been introduced. Thus, anti-reflective films for preventing reflection in bottom films may be deposited in bottom portions of photoresist films, which can be used in fine processes.

From a light source, ultraviolet rays penetrate a photoresist film, so that a light incident on the bottom layer of the photoresist film is scattered or reflected. An organic anti-reflective film absorbs the scattered or reflected light, which affects the photolithography process.

A dry lithography process uses air having a refractive index of 1.0 as a medium for transmission of an exposure beam between an exposure lens and a wafer comprising a photoresist film. Unlike the dry lithography process, an immersion lithography process uses a liquid such as H$_2$O or an organic solvent having a refractive index of 1.0 or more as a medium. As a result, even when a light source of the same wavelength is used, the immersion lithography process has the same effect as when a light source having a short wave or a lens having a high numerical aperture (NA) is used. Also, the depth of focus is not degraded.

Therefore, the immersion lithography process can improve the depth of focus, and form an ultra fine pattern using a conventional exposure wavelength.

However, when an anti-reflective composition having a low refractive index is used in the immersion lithography process, the reflectance of the exposure light source may increase, and the photoresist pattern may collapse. As a result, it is necessary to develop an anti-reflective material having a high refractive index useful for the immersion lithography process.

Meanwhile, a damascene process has been required as semiconductor device metal lines are replaced with copper. In the damascene process, after a contact hole is formed, it is necessary to perform a process for filling the contact hole sufficiently with an anti-reflective film to obtain a pattern. However, an anti-reflective film for filling the contact hole has not been developed.

BRIEF SUMMARY OF THE INVENTION

Various embodiments of the invention are directed at providing a polymer for crosslinking an anti-reflective film useful for an immersion lithography process and for a damascene process, an anti-reflective composition containing the same, and a method for forming a photoresist pattern using the same.

According to an embodiment of the invention, a polymer for crosslinking comprises a repeating unit of Formula 1:

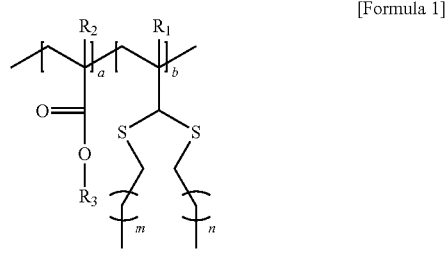

[Formula 1]

wherein R$_1$ and R$_2$ are individually hydrogen or methyl,
R$_3$ is C$_1$~C$_4$ alkyl,
m and n are each an integer ranging from 0 to 4, and
a and b are each a number of a respective repeating unit a and repeating unit b, and are each a natural number.

The repeating unit of Formula 1 is preferably represented by Formula 1a:

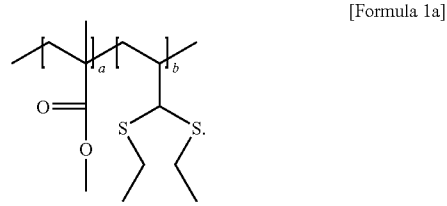

[Formula 1a]

The repeating unit of Formula 1 preferably has an average molecular weight ranging from 1,000 to 100,000.

The relative weight ratio of repeating unit a:repeating unit b is preferably 1:1.5~3.

According to one embodiment of the invention, an anti-reflective composition comprises the above polymer, a base resin capable of absorbing light, a thermal acid generator, and an organic solvent.

The base resin can be any suitable resin which can absorb light from a light source. In case of an ArF light source, the base resin capable of absorbing light preferably comprises polyvinylphenol.

The thermal acid generator can be any suitable compounds which can generate an acid by the application of heat. The thermal acid generator preferably comprises 2-hydroxycyclohexyl p-toluensulfonate.

Any suitable organic solvent can be used. For example, the organic solvent preferably comprise methyl 3-methoxypropionate (MMP), ethyl 3-ethoxypropionate (EEP), propyleneglycol methyletheracetate (PGMEA), cyclohexanone, or a combination thereof.

The base resin is preferably present in an amount ranging from 10 parts by weight to 200 parts by weight, the thermal acid generator is preferably present in an amount ranging from 5 parts by weight to 50 parts by weight, and the organic solvent is preferably present in an amount ranging from 1,000 parts by weight to 100,000 parts by weight, based on 100 parts by weight of the polymer for crosslinking of the invention.

The anti-reflective composition is particularly useful for an immersion lithography process, for example.

According to another embodiment of the invention, a method for forming a pattern of a semiconductor device comprises: coating the anti-reflective composition of the invention over an underlying layer; baking the anti-reflective composition coating by a baking process to form an anti-reflective film; and forming a photoresist pattern over the anti-reflective film.

The baking process is preferably performed at 150° C.~300° C. for 30 seconds to 2 minutes. The exposure process is preferably an ArF immersion lithography process.

According to a further embodiment of the invention, a semiconductor device is manufactured by a method comprising the inventive method of forming a pattern of a semiconductor device.

In order to increase resolution of a pattern, the refractive index of the anti-reflective film should increase as the numerical aperture (NA) of an exposure apparatus is increased. Particularly, in the immersion lithography process, liquids such as $H_2O$ or an organic solvent having a refractive index greater than 1.0 are used as a medium, thereby obtaining the same effect as when a light source having a short wavelength or a lens having a high NA is used, even when a light source having the same exposure wavelength is used. An anti-reflective film having a high refractive index is preferably used in the immersion lithography process to decrease reflectance, and it is possible to obtain a vertical pattern without standing waves, and the pattern does not collapse.

The anti-reflective film of the invention comprises a sulfur atom in the polymer for crosslinking, thereby obtaining an anti-reflective film having a high refractive index. As a result, the anti-reflective film is particularly useful for an immersion lithography process.

The repeating unit of Formula 1 comprises an acrylate monomer "a" as well as a sulfur-containing monomer "b" to increase refractive index, so that a crosslinking reaction occurs slowly as compared to a polymer comprising only a sulfur-containing monomer "b." Therefore, when a contact hole is filled with the anti-reflective film in a damascene process, a flow characteristic of the anti-reflective film is improved to fill the contact hole without voids.

DESCRIPTION OF EMBODIMENTS

The invention is described in more detail below with reference to the following Examples, which are illustrative and not limiting.

Example 1

Preparation of Polymer for Crosslinking

Figure 1:
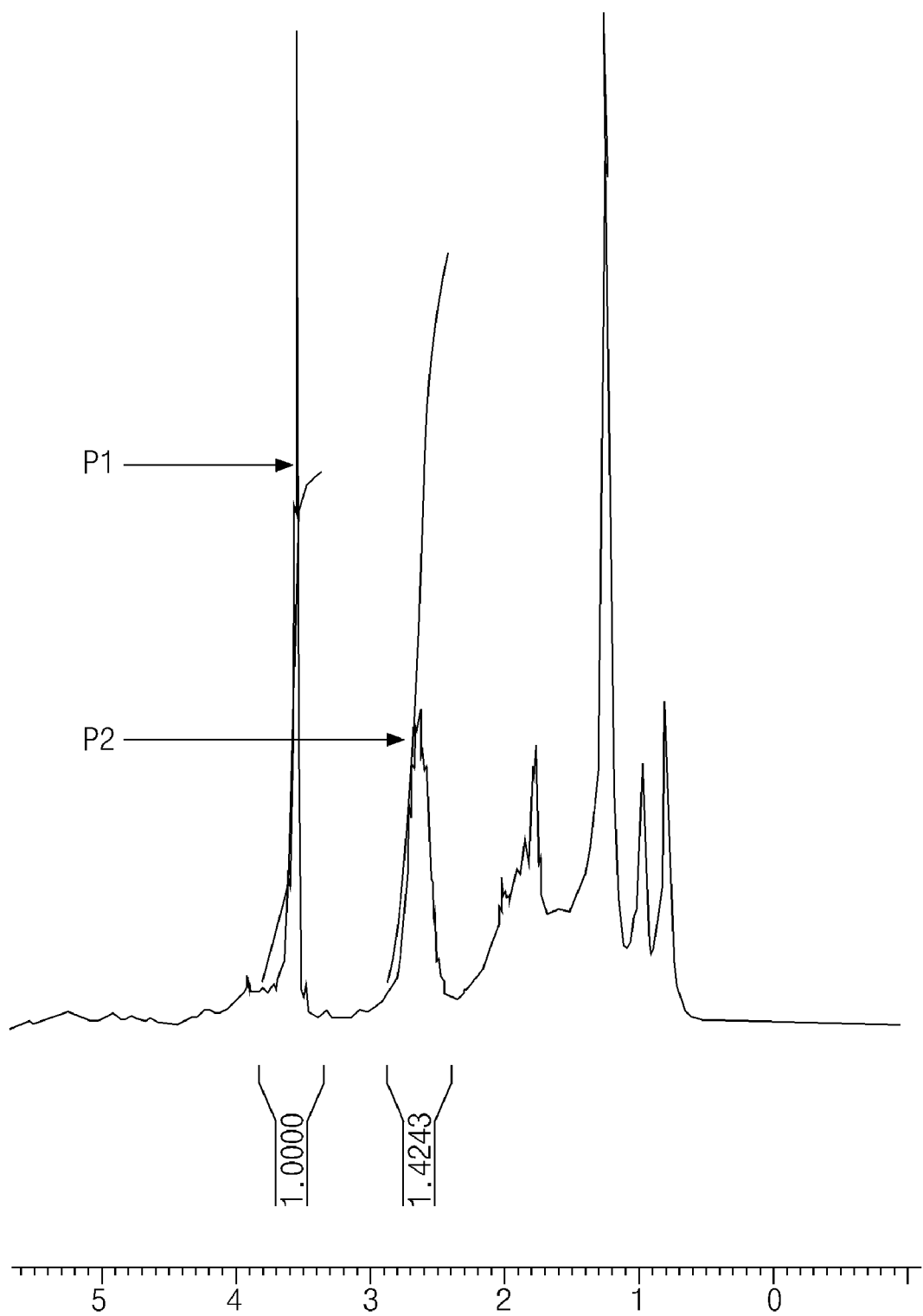
FIG. 1 is an NMR spectrum of a polymer of Example 1.

Methyl methacrylate (60 g), acrolein (40 g), AIBN (5 g), and PGMEA (400 g) were reacted at 80° C. for about 8 hours in a round bottom flask (500 ml). After reaction, the resulting mixture was precipitated in n-hexane (4 l) and dried in vacuum to obtain white powder (65 g). To the white powder, ethanethiol (300 g) and p-toluenesulfonic acid (0.5 g) were added and reacted at 32° C. for about 24 hours. After reaction, triethylamine (1 g) was added and stirred for about 30 minutes. After stirring, the resulting mixture was precipitated in distilled water to obtain a poly(methyl methacrylate/3,3,-dithioethylpropene) polymer (40 g) (see FIG. 1). In FIG. 1, peak P1 is due to a H of methoxy group in poly(methyl methacrylate), and peak P2 is due to a $CH_2$ attached to S of ethanethiol.

Example 2

Preparation of Anti-Reflective Composition

The polymer (7 g) obtained from Example 1, polyvinylphenol resin (3 g) having a molecular weight of 2500, and 2-hydroxycyclohexyl p-toluenesulfonate (0.03 g) were dissolved in PGMEA (1500 g), and filtered through a 100 nm filter to obtain an anti-reflective composition.

Example 3

Measurement of Refractive Index and Absorption Coefficient

The anti-reflective composition obtained from Example 2 was coated with 28 nm thickness over a silicon wafer, and baked at 220° C. for 60 seconds to form an anti-reflective film. Then, a refractive index (n) and an absorption coefficient (k) at 193 nm were measured with an ellipsometer. As a result, n=1.82 and k=0.22.

Example 4

Evaluation of Filling Characteristic of Contact Hole

Figure 2:
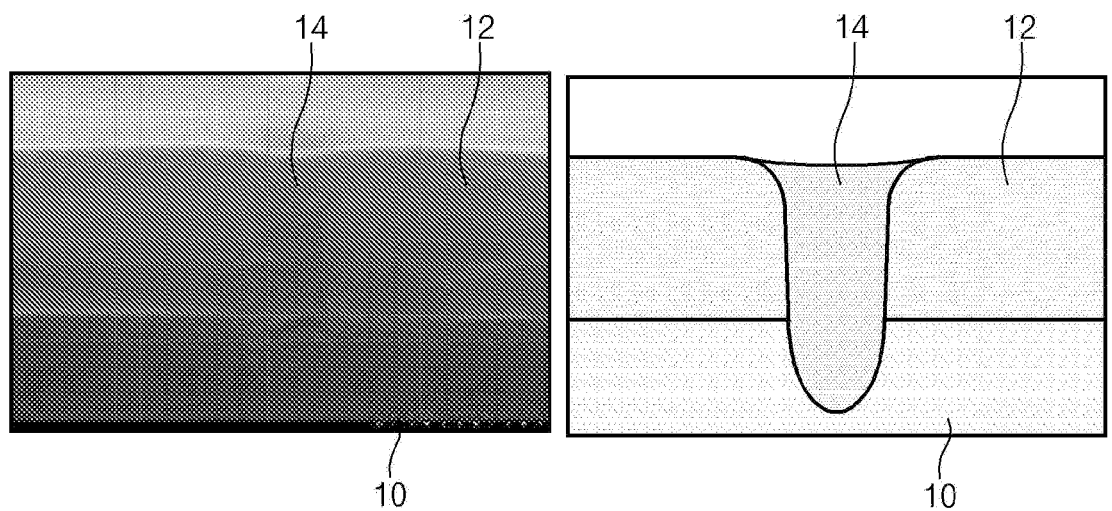
FIG. 2 is an SEM photography (left) and its drawn illustration (right) illustrating a filling characteristic of a contact hole of Example 4.

The anti-reflective composition obtained from Example 2 was coated over an oxide pattern 12 having an 80 nm contact hole, and baked at 240° C. for 1 minute. After baking, the resulting structure was cut in cross-section. As shown in FIG. 2, the anti-reflective composition 14 filled the contact hole without voids. In FIG. 2, reference number 10 represents an underlying layer, reference number 12 represents an oxide pattern, and reference number 14 represents anti-reflective composition filled in a contact hole.

Example 5

Formation of Pattern

Figure 3:
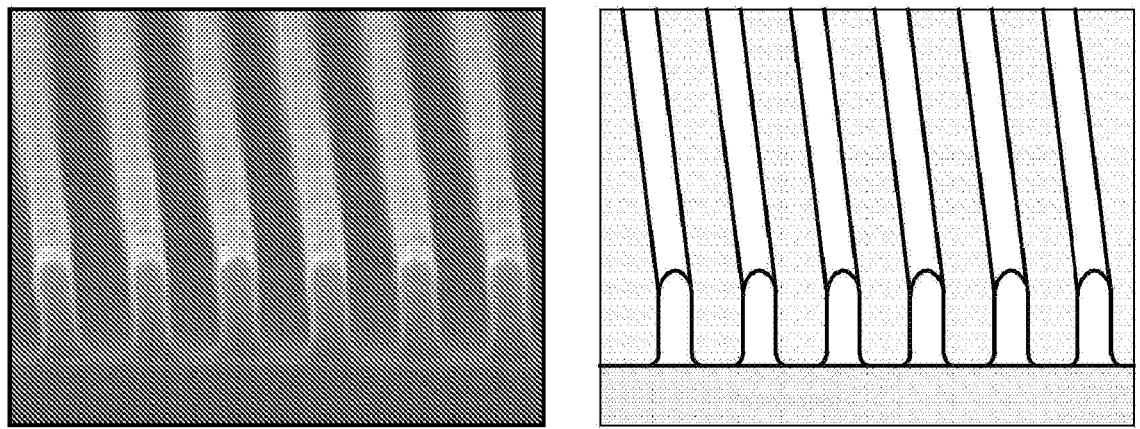
FIG. 3 is an SEM photograph (left) and its drawn illustration (right) illustrating a pattern of Example 5.

An amorphous carbon film with a thickness of 2000 Å and an SiON film with a thickness of 400 Å were sequentially coated over a silicon wafer. The anti-reflective composition obtained from Example 2 was spin-coated over the SiON film, and baked at 220° C. for 60 seconds to obtain an anti-reflective film having a thickness of 250 Å. After baking, a photoresist material for immersion lithography (AIM5076 manufactured by Japan Synthesis Rubber Co., Ltd.) was spin-coated, and baked at 110° C. for 60 seconds. The resulting structure was exposed by an immersion exposure apparatus (1700i manufactured by ASML Co.), and post-baked at 105° C. for 60 seconds. After post-baking, the resulting structure was developed with a 2.38 wt % TMAH (tetramethylammonium hydroxide) developing solution to obtain a vertical pattern without standing waves (see FIG. 3).

As described above, an anti-reflective film according to an embodiment of the invention comprises a sulfur atom in a polymer for crosslinking, so that an anti-reflective film having a high refractive index can be formed. Also, the anti-reflective film can be useful for an immersion lithography process. In the immersion lithography process, the anti-reflective film having a high refractive index reduces reflectance to facilitate obtaining a vertical pattern without standing waves, and prevents collapse of patterns. Also, the anti-reflective film has an excellent filling characteristic, so that it can fill a contact hole without voids. As a result, the anti-reflective film can be useful for a damascene process.

The above embodiments of the invention are illustrative and not limiting. Various alternatives and equivalents are possible. The invention is not limited by the type of deposition, etching polishing, and patterning steps described herein, nor is the invention limited to any specific type of semiconductor device. For example, the invention may be implemented in a dynamic random access memory DRAM device or in a non-volatile memory device. Other additions, subtractions, or modifications are intended to fall within the scope of the appended claims.

What is claimed is:

1. A polymer comprising a repeating unit of Formula 1:

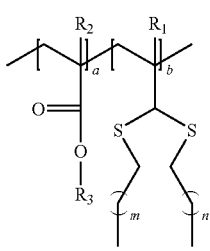

[Formula 1]

wherein $R_1$ and $R_2$ are individually hydrogen or methyl,
$R_3$ is $C_1$~$C_4$ alkyl,
m and n are each an integer ranging from 0 to 4, and
a and b are each a natural number designating a repeating unit "a" and a repeating unit "b," respectively.

2. The polymer according to claim 1, wherein the repeating unit of Formula 1 is represented by Formula 1a:

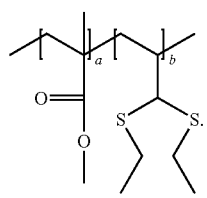

[Formula 1a]

3. The polymer according to claim 1, wherein the repeating unit of Formula 1 has an average molecular weight ranging from 1,000 to 100,000.

4. The polymer according to claim 1, wherein the relative weight ratio of repeating unit a:repeating unit b is 1:1.5~3.

5. An anti-reflective composition comprising the polymer of claim 1, a base resin capable of absorbing light, a thermal acid generator, and an organic solvent.

6. The anti-reflective composition according to claim 5, wherein the base resin capable of absorbing light comprises polyvinylphenol.

7. The anti-reflective composition according to claim 5, wherein the thermal acid generator comprises 2-hydroxycyclohexyl paratoluensulfonate.

8. The anti-reflective composition according to claim 5, wherein the organic solvent is selected from the group consisting of methyl 3-methoxypropionate (MMP), ethyl 3-ethoxypropionate (EEP), propyleneglycol methyletheracetate (PGMEA), cyclohexanone, and combinations thereof.

9. The anti-reflective composition according to claim 5, wherein the base resin is present in an amount ranging from 10 to 200 parts by weight, the thermal acid generator is present in an amount ranging from 5 to 50 parts by weight, and the organic solvent is present in an amount ranging from 1,000 to 100,000 parts by weight, based on 100 parts by weight of the polymer.

10. A method for forming a pattern of a semiconductor device, the method comprising:
coating the anti-reflective composition of claim 5 over an underlying layer;
baking the anti-reflective composition coating to form an anti-reflective film; and
forming a photoresist pattern over the anti-reflective film.

11. The method according to claim 10, comprising forming the photoresist pattern by an ArF immersion lithography process.

* * * * *